(12) United States Patent
Chikama et al.

(10) Patent No.: US 9,469,897 B2
(45) Date of Patent: Oct. 18, 2016

(54) THIN FILM FORMING APPARATUS AND THIN FILM FORMING METHOD

(75) Inventors: Yoshimasa Chikama, Osaka (JP); Iwao Suzuki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 679 days.

(21) Appl. No.: 13/991,667

(22) PCT Filed: Nov. 29, 2011

(86) PCT No.: PCT/JP2011/006654
§ 371 (c)(1),
(2), (4) Date: Sep. 25, 2013

(87) PCT Pub. No.: WO2012/077298
PCT Pub. Date: Jun. 14, 2012

(65) Prior Publication Data
US 2014/0021037 A1    Jan. 23, 2014

(30) Foreign Application Priority Data
Dec. 6, 2010 (JP) ................................ 2010-271552

(51) Int. Cl.
C23C 14/00 (2006.01)
C23C 14/35 (2006.01)
C23C 14/08 (2006.01)
C23C 14/56 (2006.01)
H01J 37/34 (2006.01)

(52) U.S. Cl.
CPC ............. C23C 14/352 (2013.01); C23C 14/08 (2013.01); C23C 14/564 (2013.01); H01J 37/3417 (2013.01); H01J 37/3429 (2013.01); H01J 37/3447 (2013.01); H01J 37/3455 (2013.01)

(58) Field of Classification Search
CPC ............. H01J 37/3455; H01J 37/3447; H01J 37/3417
See application file for complete search history.

(56) References Cited

U.S. PATENT DOCUMENTS

| 6,217,730 | B1 * | 4/2001 | Nakajima | ........... C23C 14/0068 204/298.07 |
| 7,041,200 | B2 * | 5/2006 | Le | ........... C23C 14/34 204/192.12 |
| 2008/0000768 | A1 * | 1/2008 | Stimson | ........... C23C 14/3407 204/192.1 |
| 2010/0126852 | A1 * | 5/2010 | Ohmi | ........... C23C 14/35 204/298.03 |

(Continued)

FOREIGN PATENT DOCUMENTS

| JP | 04-006271 A | 1/1992 |
| JP | 2003-096561 A | 4/2003 |

(Continued)

OTHER PUBLICATIONS

Official Communication issued in International Patent Application No. PCT/JP2011/006654, mailed on Jan. 10, 2012.

*Primary Examiner* — Keith Hendricks
*Assistant Examiner* — Timon Wanga
(74) *Attorney, Agent, or Firm* — Keating & Bennett, LLP

(57) ABSTRACT

A thin film forming apparatus includes a substrate holding portion and a target portion. The target portion has a plurality of targets arranged at predetermined intervals and parallel to a substrate held by the substrate holding portion. The substrate holding portion is configured to move the substrate parallel to the target portion. A shield portion configured to block sputtered particles flying from the target portion is placed on the target portion side of the substrate so as to face a gap between adjoining ones of the targets.

8 Claims, 6 Drawing Sheets

(56) References Cited

U.S. PATENT DOCUMENTS

2010/0155225 A1* 6/2010 Oishi ............... H01J 37/32376
  204/192.12
2011/0177696 A1 7/2011 Yano et al.

FOREIGN PATENT DOCUMENTS

| JP | 2006-299412 A | 11/2006 |
| WO | 2008/108185 A1 | 9/2008 |
| WO | 2009/142289 A1 | 11/2009 |

* cited by examiner

THIN FILM FORMING APPARATUS AND THIN FILM FORMING METHOD

TECHNICAL FIELD

The present invention relates to thin film forming apparatuses and thin film forming methods.

BACKGROUND ART

A sputtering method is commonly known as a method of forming a thin film on a substrate surface. The sputtering method is widely known as a dry process technique that is essential for a film deposition technique. The sputtering method is a method of depositing a film by introducing a rare gas such as Ar gas into a vacuum container and supplying direct current (DC) power or high frequency (RF) power to a cathode including a target to cause a glow discharge.

The sputtering method includes a magnetron sputtering method capable of depositing a film at a high speed by increasing plasma density near the surface of a target by placing a magnet on the back side of the target in an electrically grounded chamber. Such a sputtering method is used by a process of forming a predetermined thin film on, e.g., a processing substrate having a large area such as a glass substrate forming a liquid crystal display panel etc.

For example, Patent Document 1 discloses that in a magnetron sputtering apparatus having a plurality of targets arranged at predetermined intervals and parallel to a substrate to be processed, an alternating current (AC) voltage that alternates in polarity at a predetermined frequency is applied to each target to cause a glow discharge with anode and cathode electrodes being alternately switched between each pair of adjoining targets, whereby a plasma atmosphere is produced.

On the other hand, Patent Document 2 discloses that in a magnetron sputtering apparatus having a plurality of targets to which a voltage of the same polarity is applied, the substrate is moved parallel to the targets.

CITATION LIST

Patent Document

PATENT DOCUMENT 1: Japanese Patent Publication No. 2003-96561
PATENT DOCUMENT 2: Japanese Translation of PCT International Application No. WO/2008-108185

SUMMARY OF THE INVENTION

Technical Problem

In the sputtering apparatus of Patent Document 1, since the predetermined interval is provided between adjoining ones of the targets, quality of the sputtered thin film may vary between the region facing the target and the region facing the gap between the targets. One solution to this problem is to move the substrate with respect to the targets to achieve uniform quality of the thin film formed on the substrate, as in Patent Document 2.

However, in the sputtering apparatus described in Patent Document 1, not only sputtered particles traveling straight from the target in a direction perpendicular to the substrate but also sputtered particles flying obliquely from other targets are deposited on the region facing the target on the substrate.

Since the sputtered particles flying in different directions with respect to the substrate surface are deposited on the substrate, the quality of the thin film formed on the substrate is not uniform, and it is difficult to form a thin film having desired quality with high controllability.

The present invention was developed in view of the above problems, and it is an object of the present invention to form a thin film having desired quality with high controllability.

Solution to the Problem

In order to achieve the above object, a thin film forming apparatus according to the present invention is a thin film forming apparatus including: a substrate holding portion configured to hold a substrate; and a target portion placed so as to face a substrate held by the substrate holding portion.

The target portion has a plurality of targets arranged at predetermined intervals and parallel to the substrate held by the substrate holding portion. The substrate holding portion is configured to move the substrate held by the substrate holding portion, parallel to the target portion. A shield portion configured to block sputtered particles flying from the target portion is placed on the target portion side of the substrate held by the substrate holding portion, so as to face a gap between adjoining ones of the targets.

According to the above thin film forming apparatus, the substrate held by the substrate holding portion is moved parallel to the target portion, and plasma is generated on the substrate side of the target portion. Thus, the sputtered particles as constituent particles of the targets fly from the target portion toward the substrate. Since the shield portion is placed on the target portion side of the substrate so as to face the gap between adjoining ones of the targets, the sputtered particles flying from the targets perpendicularly to the substrate are deposited as they are on the substrate, while the sputtered particles flying from the targets obliquely to the substrate are blocked by the shield portion. That is, since the shield portion can suppress deposition of the sputtered particles flying obliquely to the substrate surface on the substrate, a thin film having desired quality can be formed on the substrate with high controllability.

Advantages of the Invention

According to the present invention, since the shield portion facing the gap between adjoining ones of the targets is placed on the target portion side of the substrate, deposition of the sputtered particles flying obliquely to the substrate surface on the substrate can be suppressed, whereby a thin film having desired quality can be formed on the substrate with high controllability.

DESCRIPTION OF EMBODIMENTS

Embodiments of the present invention will be described in detail below with reference to the accompanying drawings. The present invention is not limited to the following embodiments.

First Embodiment

FIGS. 1-4 show a first embodiment of the present invention.

Figure 1:
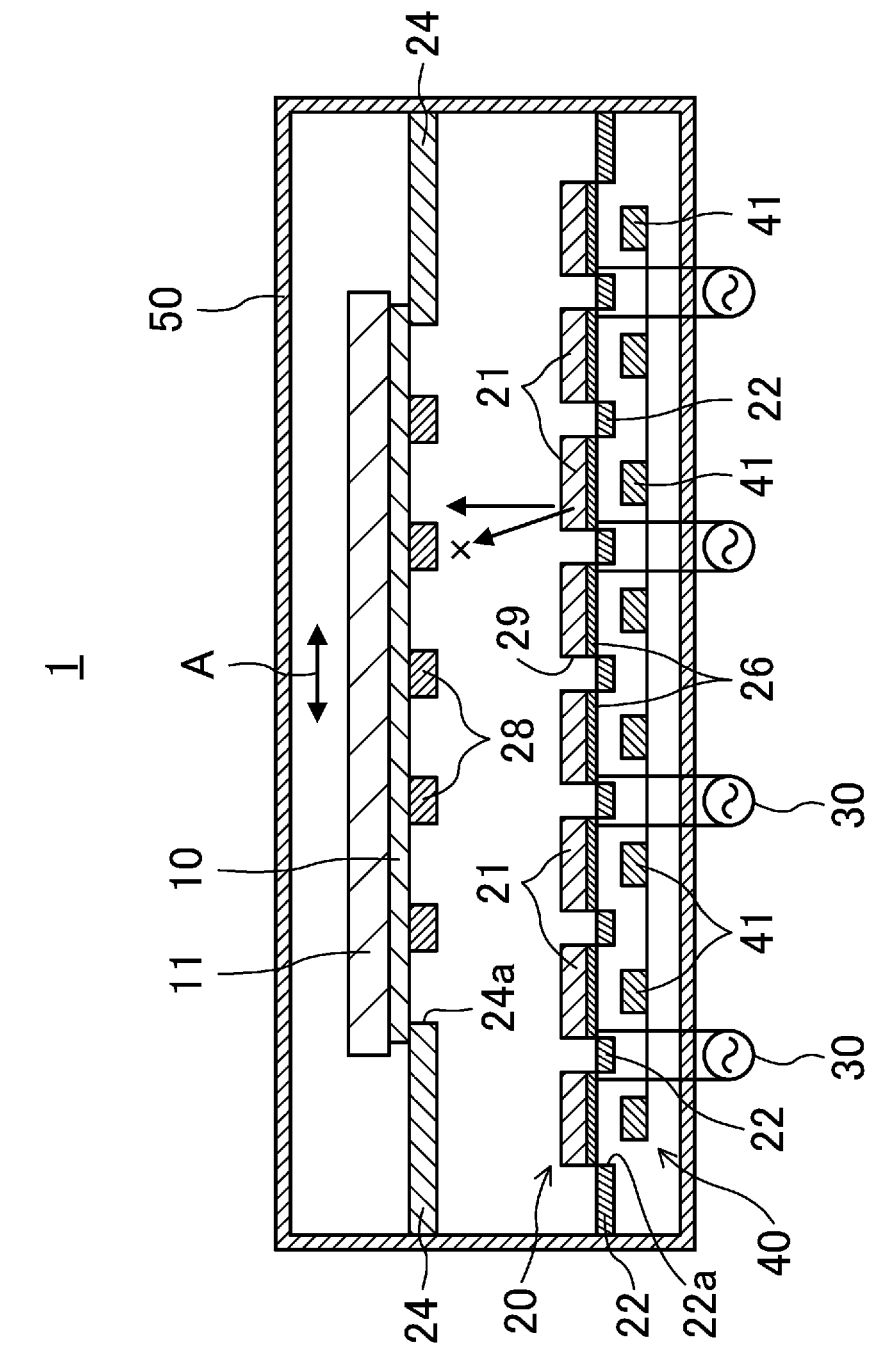
FIG. 1 is a sectional view showing the general configuration of a magnetron sputtering apparatus according to a first embodiment.
Figure 2:
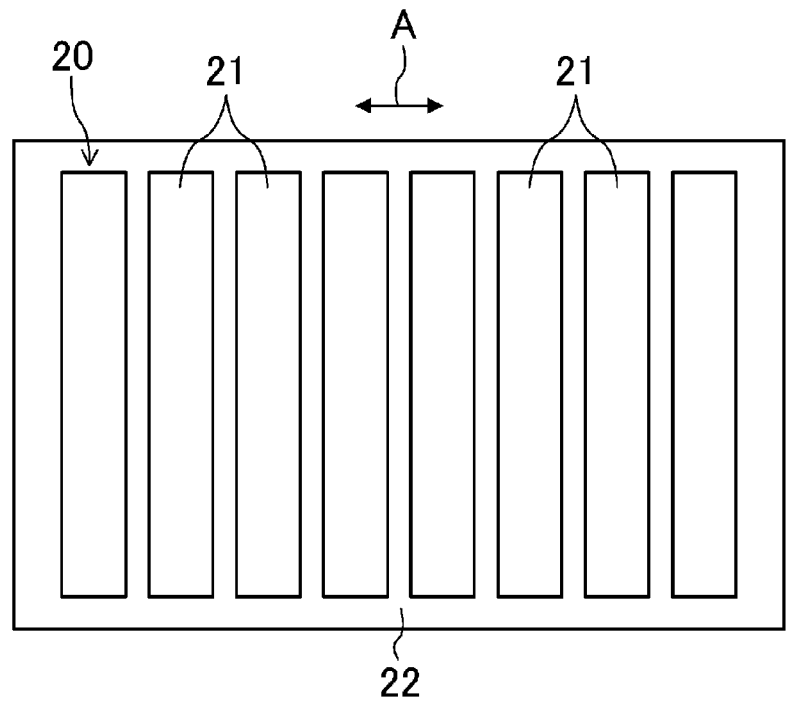
FIG. 2 is a plan view showing a target portion according to the first embodiment.
Figure 3:
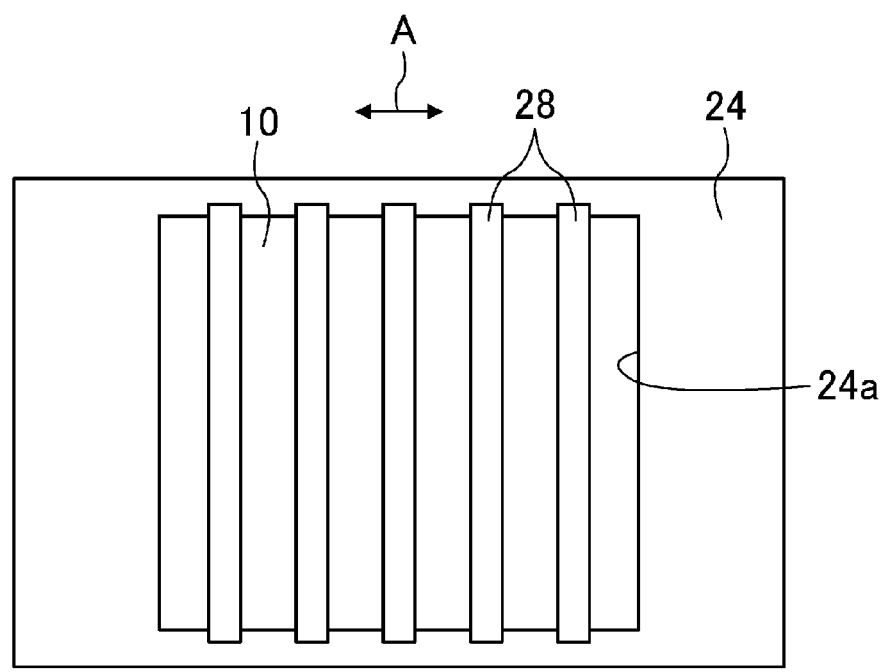
FIG. 3 is a bottom view showing shield portions according to the first embodiment.
Figure 4:
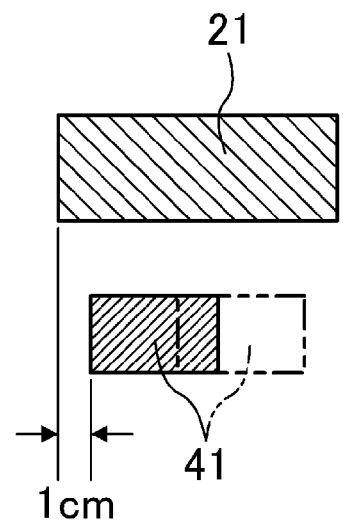
FIG. 4 is an enlarged sectional view of a target and a magnet.

FIG. 1 is a sectional view showing the general configuration of a thin film forming apparatus 1 according to the first embodiment. FIG. 2 is a plan view showing a target portion 20 according to the first embodiment. FIG. 3 is a bottom view showing shield portions according to the first embodiment. FIG. 4 is an enlarged sectional view of a target 21 and a magnet 41.

As shown in FIG. 1, a magnetron sputtering apparatus 1 as the thin film forming apparatus of the first embodiment includes a substrate holding portion 11 configured to hold a substrate 10, a target portion 20 placed so as to face the substrate 10 that is held by the substrate holding portion 11, a power source 30 configured to supply electric power to the target portion 20, a magnet portion 40 placed on the back side of the target portion 20 as the side of the target portion 20 facing opposite the substrate 10, and a chamber 50 configured to accommodate the substrate holding portion 11, the target portion 20, and the magnet portion 40.

The chamber 50 is a vacuum chamber with its sidewall electrically grounded. The apparatus main body including the chamber 50 is comprised of, e.g., aluminum, stainless steel, etc. A vacuum pump, not shown, is connected to the chamber 50 so that the chamber 50 is decompressed by the vacuum pump. The chamber 50 is provided with a gas supply portion (not shown). The gas supply portion is configured to introduce an Ar gas and, as necessary, an $O_2$ gas into the chamber 50 in a vacuum state.

The substrate 10 is a substrate such as a glass substrate that forms, e.g., a liquid crystal display panel (not shown). The substrate 10 has a size of, e.g., 730 mm by 920 mm. The substrate holding portion 11 holds the substrate 10 on its lower surface, and has a heater (not shown) configured to heat the substrate 10 when depositing a film. A substrate mask 24 that covers the outer edge portion of the lower surface of the substrate 10 is provided in the chamber 50. The substrate mask 24 serves to prevent unnecessary adhesion of sputtered particles to the substrate 10 and the chamber 50, and has a rectangular opening 24a in the center thereof.

As shown in FIGS. 1 and 2, the target portion 20 has a plurality of targets 21 arranged at predetermined intervals and parallel to the substrate 10 held by the substrate holding portion 11. Each target 21 is formed in the shape of, e.g., a rectangular plate, and the targets 21 are arranged in a predetermined direction (the lateral direction in FIGS. 1 and 2) and parallel to each other so that their longer sides adjoin each other. The targets 21 are arranged at predetermined intervals in the direction in which the magnet portion 40 is moved.

The targets 21 are comprised of, e.g., a material containing IGZO (In—Ga—$ZnO_4$; amorphous oxide semiconductor). The targets 21 may be comprised of other semiconducting material. Each target 21 is formed in the shape of, e.g., a 200 mm by 3,400 mm rectangular plate.

Each target 21 is supported by a target support portion 22 via a backing plate 26. Each backing plate 26 is comprised of a conductive material such as a metal material, and serves to cool the target 21 during a sputtering process. The target 21 is bonded to the backing plate 26 via a bonding material such as indium or tin.

The target support portion 22 is comprised of an insulating material, and is fixedly attached to the chamber 50. The target support portion 22 has a plurality of openings 22a corresponding to the targets 21. As shown in FIG. 1, the targets 21 and the backing plates 26 are arranged so as to correspond to the openings 22a.

One AC power source 30 is connected to every pair of adjoining targets 21. The frequency of a drive voltage (cathode voltage) of the power source 30 is, e.g., about 19 kHz to 20 kHz. Drive power is about 10-90 kW.

The magnet portion 40 is configured to reciprocate along the back surface of the target portion 20 by a drive mechanism, not shown. As shown in FIG. 1, the magnet portion 40 has a plurality of magnets 41 arranged at predetermined intervals in the direction in which the magnet portion 40 is moved (the lateral direction in FIG. 1). The magnets 41 are provided so as to correspond to the targets 21, and are comprised of permanent magnets. Each magnet 41 is formed in the shape of, e.g., a 100 mm by 3,350 mm rectangular plate. The width of the magnet 41 in the direction in which the magnet 41 is moved is smaller than that of the target 21 in this direction.

The magnets 41 swing in synchronization with each other. The magnets 41 swing at a speed of, e.g., 10 mm/s to 30 mm/s. As shown in FIG. 4, each magnet 41 swings along a corresponding one of the targets 21, with its swing ends being located about 1 cm inside both ends of this target 21.

The substrate holding portion 11 is configured so that the substrate 10 held by the substrate holding portion 11 is moved parallel to the target portion 20 by, e.g., a roller mechanism etc. The substrate holding portion 11 reciprocates the substrate 10 in the lateral direction as shown by arrow A in FIG. 1.

Moreover, as shown in FIG. 1, a shield portion 28 configured to block sputtered particles flying from the target portion 20 is placed on the target portion 20 side of the substrate 10 held by the substrate holding portion 11, so as to face a gap 29 between adjoining ones of the targets 21.

As shown in FIGS. 1 and 3, the shield portion 28 is formed in the shape of, e.g., a 100 mm by 3,500 mm rectangular plate, and a plurality of the shield portions 28 are provided so as to correspond to the respective gaps 29 between the targets 21. The shield portions 28 are comprised of, e.g., titanium, stainless steel, etc. Both ends of each shield portion 28 are fixedly attached to the substrate mask 24. The width of the shield portion 28 in the direction A (i.e., the direction in which the plurality of targets 21 are arranged) is larger than that of the gap 29 in the direction A. For example, the shield portion 28 overlaps the entire gap 29, and overlaps side portions of the targets 21 by a width of about 4 cm.

According to the magnetron sputtering apparatus 1, an AC voltage that alternates in polarity at a predetermined frequency is applied from the power sources 30 to the targets 21 to cause a glow discharge with anode and cathode electrodes being alternately switched between each pair of adjoining targets 21, whereby a plasma atmosphere is produced in the chamber 50. The plasma causes Ar ions to bombard the targets 21, causing sputtered particles to fly from the targets 21 toward the substrate 10. A film is thus deposited on the surface of the substrate 10.

Thin Film Forming Method

A method of forming a thin film on the substrate 10 by the magnetron sputtering apparatus 1 will be described below.

In the case of depositing a film on the substrate 10 by the magnetron sputtering apparatus 1, the substrate 10 as a glass substrate is first carried into the chamber 50, and is held by the substrate holding portion 11. Next, the chamber 50 is decompressed by the vacuum pump (not shown), and the substrate 10 is heated with the heater (not shown) of the substrate holding portion 11. The targets 21 are comprised of, e.g., a material containing IGZO (In—Ga—ZnO$_4$; amorphous oxide semiconductor).

Then, an Ar gas, and as necessary, an O$_2$ gas are introduced into the chamber 50 by the gas supply portion (not shown) while maintaining high vacuum. Subsequently, a predetermined AC voltage is applied from the power sources 30 to supply electric power to the target portion 20 and to swing the magnet portion 40. The magnet portion 40 swings at a speed of, e.g., about 10 mm/s to 30 mm/s. Moreover, the substrate 10 held by the substrate holding portion 11 is reciprocated in the direction A in FIG. 1.

The thin film can be efficiently deposited with higher quality by swinging the magnets 41 in such a range that the magnets 41 do not overlap the shield portions 28 in the direction perpendicular to the surface of the substrate 10.

A glow discharge is thus caused between the target portion 20 and the wall surface of the chamber 50, whereby plasma is generated on the substrate 10 side of the target portion 20. Positive Ar ions produced by this plasma are attracted toward the target portion 20. The Ar ions bombard the targets 21, and sputtered particles as constituent particles of the targets 21 are ejected from the targets 21 and fly toward the substrate 10.

The sputtered particles flying from the targets 21 perpendicularly to the surface of substrate 10 adhere to and deposited on the surface of the substrate 10 which is located between the shield portions 28 and faces the targets 21. On the other hand, part of the sputtered particles flying from the targets 21 obliquely to the surface of the substrate 10 is blocked by the shield portions 28 and adheres to the shield portions 28.

In this manner, the shield portions 28 are placed on the target portion 20 side of the substrate 10 so as to face the gaps 29 between the targets 21, and the substrate 10 is moved parallel to the target portion 20, whereby a thin IGZO film is formed on the substrate 10.

Advantages of First Embodiment

As described above, according to the first embodiment, the substrate 10 is reciprocated parallel to the target portion 20, and the shield portions 28 facing the gaps 29 between adjoining ones of the targets 21 are placed on the target portion 20 side of the substrate 10. Thus, the sputtered particles flying from the targets 21 perpendicularly to the substrate 10 can be deposited as they are on the substrate 10, while the sputtered particles flying from the targets 21 obliquely to the substrate 10 can be blocked by the shield portions 28.

That is, since the shield portions 28 can suppress deposition of the sputtered particles flying from the targets 21 obliquely to the surface of the substrate 10 on the substrate 10, a thin film having desired quality can be formed on the substrate 10 with high controllability without adding a complicated mechanism configuration to the magnetron sputtering apparatus.

Second Embodiment

Figure 5:
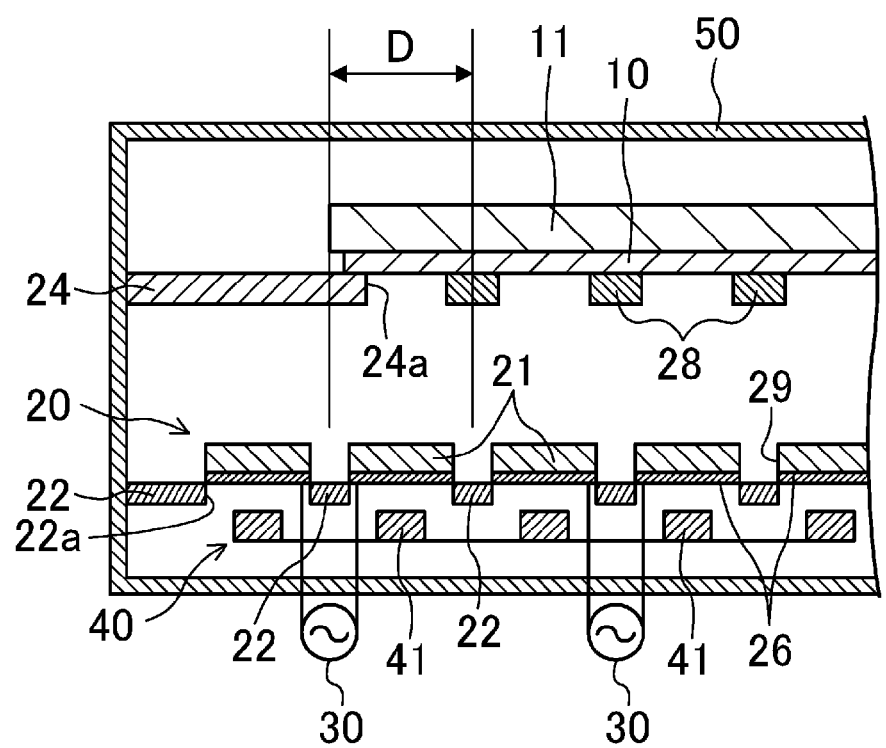
FIG. 5 is an enlarged sectional view showing a part of a magnetron sputtering apparatus according to a second embodiment.

FIG. 5 shows a second embodiment of the present invention.

FIG. 5 is an enlarged sectional view showing a part of a magnetron sputtering apparatus 1 according to the second embodiment. In the following embodiments, the same portions as those of FIGS. 1-4 are denoted by the same reference characters, and detailed description thereof will be omitted.

In the second embodiment, the magnetron sputtering apparatus 1 described in the first embodiment is improved in a manner in which the substrate holding portion 11 holding the substrate 10 is moved.

That is, as shown in FIG. 5, the substrate holding portion 11 in the second embodiment is configured to reciprocate by a width D corresponding to a region facing one target 21 and at least a part of the gap 29 located on each of both right and left sides of this target 21.

In the case of forming a thin film on the substrate 10 by the magnetron sputtering apparatus 1 of the second embodiment, in the thin film forming method of the first embodiment, the substrate holding portion 11 reciprocates by a width corresponding to a region facing one target 21 and at least a part of the gap 29 located on each of both right and left sides of this target 21.

Thus, according to the second embodiment, the substrate 10 that reciprocates faces all of the targets 21 and the gaps 29 therebetween (the gaps 29 where the power source 30 is placed and the gaps 29 where the power source 30 is not placed), whereby the quality of the thin film formed on the substrate 10 can further be improved.

Third Embodiment

Figure 6:
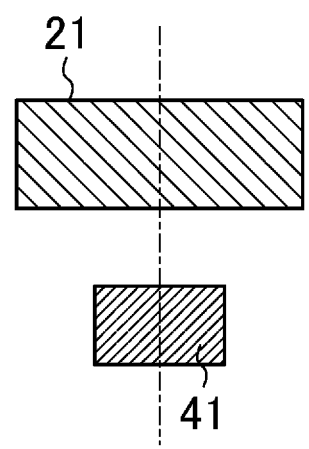
FIG. 6 is an enlarged sectional view of a target and a magnet.

FIG. 6 shows a third embodiment of the present invention.

FIG. 6 is an enlarged sectional view of the target 21 and the magnet 41.

In the third embodiment, when forming a thin film by using the magnetron sputtering apparatus 1 of the first embodiment, movement of the magnets 41 is restricted at the start of film deposition on the substrate 10.

That is, in a thin film forming method of the third embodiment, as shown in FIG. 6, each magnet 41 is made stationary at the central position of a corresponding one of the targets 21 during a predetermined period from the start of film deposition. In particular, the predetermined period is a period from the start of film deposition until the substrate holding portion 11 initially moves to the outermost position in the reciprocating direction A (i.e., the swing end in the lateral direction in FIG. 1). After the predetermined period, the magnets 41 are swung in a manner similar to that of the first embodiment.

Moving the magnet portion 40 at the start of film deposition on the substrate 10 makes the plasma state in the chamber 50 uneven, which tends to reduce the quality of a thin film formed at the start of film deposition. In the third embodiment, each magnet 41 is made stationary at the central position of a corresponding one of the targets 21 during the predetermined period from the start of film deposition on the substrate 10. Thus, the magnets 41 can be moved to deposit a thin film after the plasma state is stabilized, whereby the quality of the thin film can further be enhanced. In this case, the thin film formed on the substrate 10 is a film comprised of two layers having different qualities.

Fourth Embodiment

Figure 7:
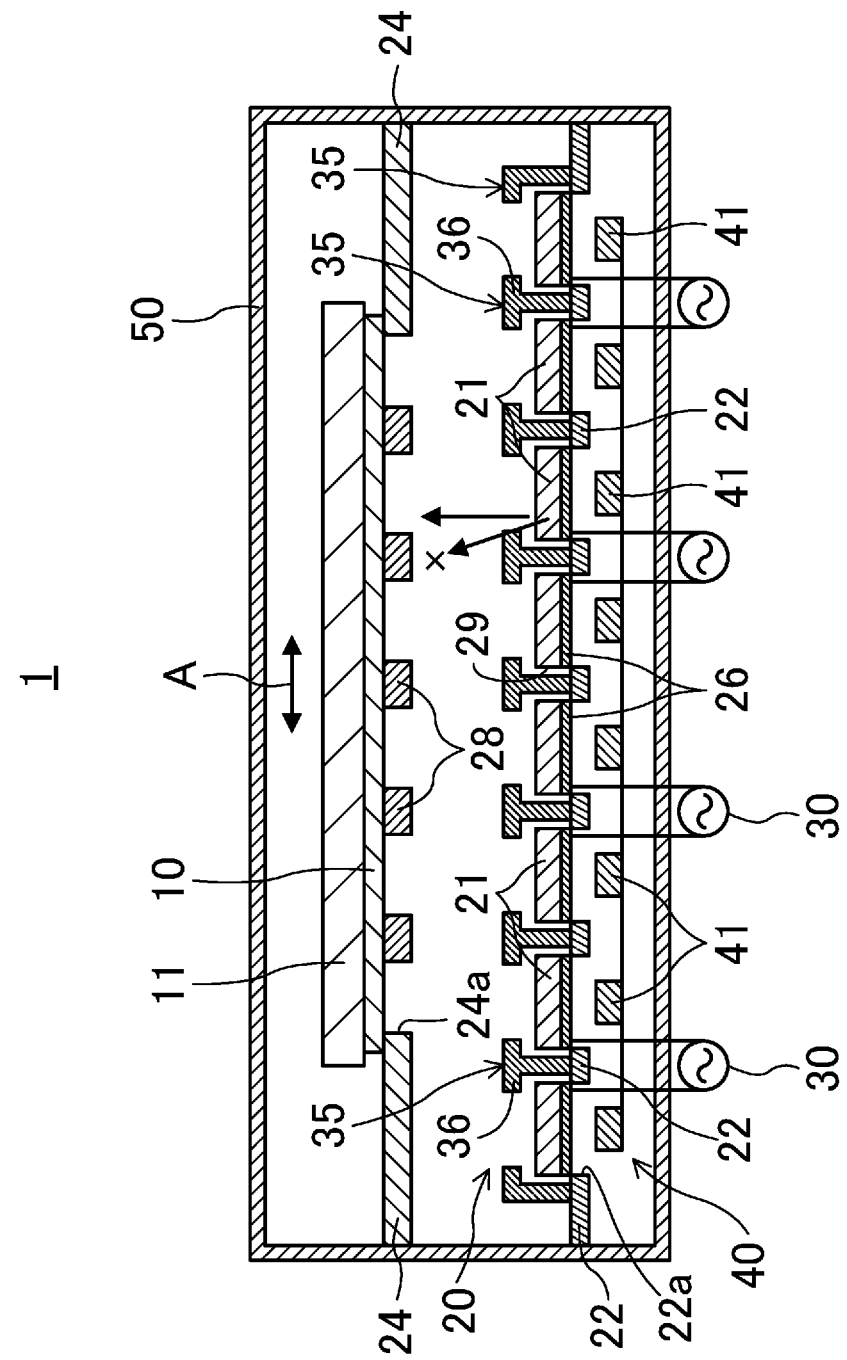
FIG. 7 is a sectional view showing the general configuration of a magnetron sputtering apparatus according to a third embodiment.
Figure 8:
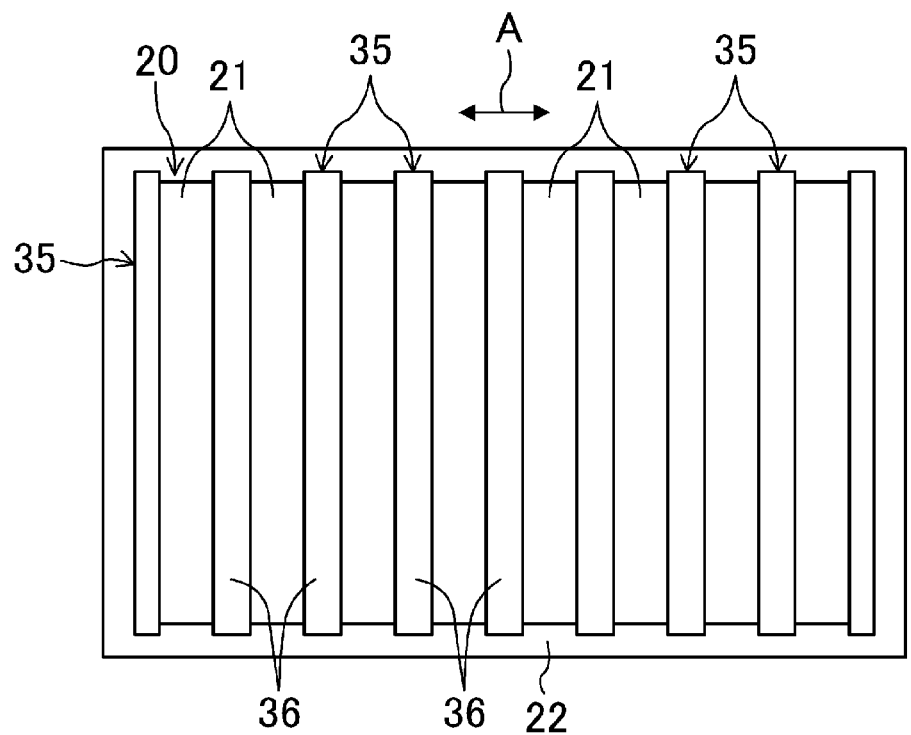
FIG. 8 is a plan view showing a target portion and partition wall portions according to the third embodiment.
Figure 9:
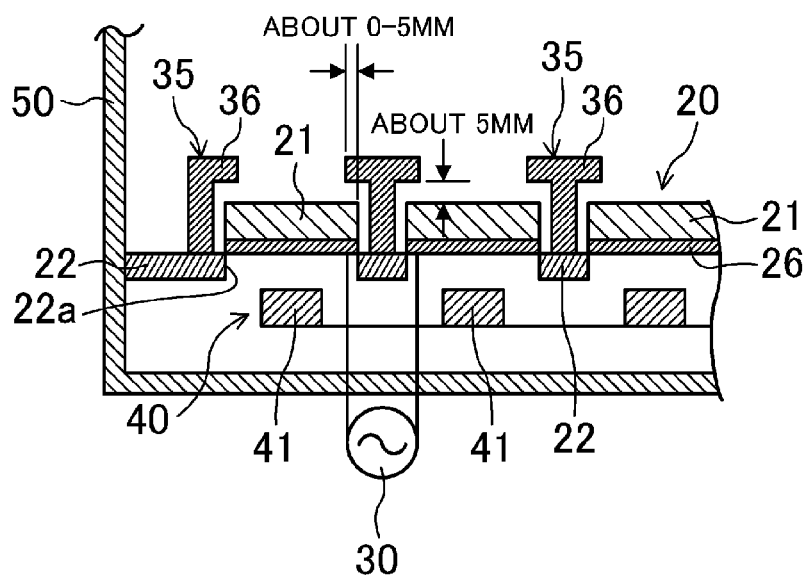
FIG. 9 is an enlarged sectional view showing a region around targets and the partition wall portions according to the third embodiment.

FIGS. 7 to 9 show a fourth embodiment of the present invention.

FIG. 7 is a sectional view showing the general configuration of the magnetron sputtering apparatus 1 according to the third embodiment. FIG. 8 is a plan view showing the target portion 20 and partition wall portions 35 according to the third embodiment. FIG. 9 is an enlarged sectional view showing a region around the targets 21 and the partition wall portions 35 according to the third embodiment.

In the fourth embodiment, the partition wall portions 35 are provided in the gaps 29 between the targets 21 in the magnetron sputtering apparatus 1 described in the first embodiment.

That is, as shown in FIGS. 7 and 8, the magnetron sputtering apparatus 1 of the third embodiment has the partition wall portions 35 each provided between adjoining ones of the targets 21 and configured to block sputtered particles flying from the targets 21. As shown in FIG. 9, each partition wall portion 35 has a flange portion (protrusion portion) 36 that faces a portion on the gap 29 side of the surface on the substrate holding portion 11 side of the target 21 (i.e., a portion of the end along the longer side of the target 21). That is, as shown in FIG. 9, each partition wall portion 35 has a T-shaped or L-shaped section.

The flange portion 36 of the partition wall portion 35 overlaps the target 21 by a width of, e.g., larger than about 0 mm and equal to or less than about 5 mm A gap of about 5 mm is provided between the flange portion 36 and the surface of the target 21 facing the flange portion 36.

Thus, in the case of forming a thin film on the substrate 10 by the magnetron sputtering apparatus 1, film deposition on the substrate 10 is performed with each partition wall portion 35 being provided between adjoining ones of the targets 21.

In this case, the thin film can be efficiently deposited with higher quality by swinging the magnets 41 in such a range that the magnets 41 do not overlap the partition wall portions 35 in the direction perpendicular to the surface of the substrate 10.

As described above, according to the fourth embodiment, each partition wall portion 35 is provided between adjoining ones of the targets 21. Thus, sputtered particles flying from the target portion 20 obliquely to the substrate 10 can be blocked not only on the part of the substrate 10 but also on the part of the target portion 20 by the partition wall portions 35. This further reduces arrival of the obliquely flying sputtered particles at the substrate 10, whereby the quality of the thin film formed on the substrate 10 can further be enhanced.

OTHER EMBODIMENTS

Although the first embodiment is described with respect to an example in which the shield portions 38 are arranged so as to extend parallel to the targets 21, the shield portion 28 may further be provided so as to surround the opening 24a in the substrate mask 24 in FIG. 3. Although the fourth embodiment is described with respect to an example in which the partition walls 35 are arranged so as to extend parallel to the targets 21, the partition wall portion 35 may further be provided so as to surround the targets 21 in FIG. 8. This can further improve the quality of the thin film formed on the substrate 10.

Although each of the above embodiments is described with respect to an example in which the magnets 41 are moved in the same direction as the direction A in which the substrate 10 is moved (that is, the direction of the shorter side of the target 21), the magnets 41 may be moved in a direction perpendicular to the direction A in which the substrate 10 is moved (that is, the direction of the longer side of the target 21), or may be moved in a direction perpendicular to the surface of the substrate 10.

The present invention is not limited to the first to fourth embodiments, and includes a configuration obtained by combining the first to fourth embodiments as appropriate.

INDUSTRIAL APPLICABILITY

As described above, the present invention is useful for thin film forming apparatuses and thin film forming methods.

DESCRIPTION OF REFERENCE CHARACTERS

1 Magnetron Sputtering Apparatus
10 Substrate
11 Substrate Holding Portion
20 Target Portion
21 Target
28 Shield Portion
29 Gap
35 Partition Wall Portion
36 Flange Portion
40 Magnet Portion
41 Magnet

The invention claimed is:
1. A thin film forming apparatus, comprising:
a substrate holding portion that holds a substrate; and
a target portion facing a substrate held by the substrate holding portion, wherein
the target portion includes a plurality of targets arranged at predetermined intervals and parallel to the substrate held by the substrate holding portion,
the substrate holding portion moves the substrate held by the substrate holding portion parallel to the target portion,
the thin film forming apparatus further includes a shield portion that blocks sputtered particles flying from the target portion, the shield portion is placed on the target portion side of the substrate held by the substrate holding portion, so as to face a gap between adjoining ones of the targets,
the thin film forming apparatus further includes a partition wall portion provided between the adjoining ones of the targets,
the partition wall portion blocks the sputtered particles flying from the targets,
the partition wall portion includes flange portions that extend from the partition wall portion and face a portion of the gap between the adjoining ones of the targets, and the flange portions are provided above the targets such that lower surfaces of each of the flange portions are above uppermost surfaces of the targets, and the lower surfaces of each of the flange portions overlap ends of the gap between the adjoining ones of the targets.

2. The thin film forming apparatus of claim 1, wherein the substrate holding portion reciprocates along an entire width of a region facing one of the targets and at least a portion of the gap located on each of both right and left sides of the one of the targets, the entire width being equal to a sum of a total width of the one of the targets and a total width of the gap between the adjoining ones of the targets.

3. The thin film forming apparatus of claim 1, wherein the targets are made of a material containing IGZO.

4. A method of forming a thin film on a substrate by a thin film forming apparatus which includes a substrate holding portion that holds a substrate, and a target portion placed so as to face a substrate held by the substrate holding portion, and in which the target portion includes a plurality of targets arranged at predetermined intervals and parallel to the substrate held by the substrate holding portion, comprising:
    forming a thin film on the substrate by moving the substrate held by the substrate holding portion, parallel to the target portion, wherein a shield portion configured to block sputtered particles flying from the target portion is placed on the target portion side of the substrate held by the substrate holding portion, so as to face a gap between adjoining ones of the targets;
    causing the substrate holding portion to reciprocate along an entire width of a region facing one of the targets and at least a portion of the gap located on each of both right and left sides of the one of the targets, the entire width being equal to a sum of a total width of the one of the targets and a total width of the gap between the adjoining ones of the targets; and
    causing a magnet portion of the thin film forming apparatus on a back side of the target portion at a side of the target portion facing opposite the substrate to reciprocate along a back surface of the target portion; wherein
    the magnet portion includes a plurality of magnets arranged at predetermined intervals in a direction in which the magnet portion reciprocates; and
    each of the magnets is stationary at a central position of a corresponding one of the targets during a predetermined period from a start of the step of forming the thin film on the substrate.

5. The method of claim 4, wherein
during the step of forming the thin film, a partition wall portion, which blocks the sputtered particles flying from the targets and which includes flange portions that extend from the partition wall portion and face a portion of the gap between the adjoining ones of the targets, is provided between the adjoining ones of the targets.

6. The method of claim 4, wherein the targets are made of a material containing IGZO.

7. A method of forming a thin film on a substrate by a thin film forming apparatus which includes a substrate holding portion that holds a substrate, and a target portion placed so as to face a substrate held by the substrate holding portion, and in which the target portion includes a plurality of targets arranged at predetermined intervals and parallel to the substrate held by the substrate holding portion, comprising:
    forming a thin film on the substrate by moving the substrate held by the substrate holding portion, parallel to the target portion, wherein a shield portion that blocks sputtered particles flying from the target portion is placed on a target portion side of the substrate held by the substrate holding portion, so as to face a gap between adjoining ones of the targets; wherein
    during the step of forming the thin film, a partition wall portion, which blocks the sputtered particles flying from the targets and which includes flange portions that extend from the partition wall portion and face a portion of the gap between the adjoining ones of the targets, is provided between the adjoining ones of the targets; and
    the flange portions are provided above the targets such that lower surfaces of each of the flange portions are above uppermost surfaces of the targets, and the lower surfaces of each of the flange portions overlap ends of the gap between the adjoining ones of the targets.

8. The method of claim 7, wherein the targets are made of a material containing IGZO.

* * * * *